US009166071B2

(12) United States Patent
Phan et al.

(10) Patent No.: US 9,166,071 B2
(45) Date of Patent: Oct. 20, 2015

(54) POLARIZATION RESISTANT SOLAR CELL DESIGN USING AN OXYGEN-RICH INTERFACE LAYER

(75) Inventors: Bill Phan, San Jose, CA (US); Renhua Zhang, Sunnyvale, CA (US); John Gorman, Los Gatos, CA (US); Omar Sidelkheir, Sunnyvale, CA (US); Jean Patrice Rakotoniaina, Berlin (DE); Alain Paul Blosse, Belmont, CA (US); Martin Kaes, Berlin (DE)

(73) Assignee: Silicor Materials Inc., San Jose, CA (US)

( * ) Notice: Subject to any disclaimer, the term of this patent is extended or adjusted under 35 U.S.C. 154(b) by 749 days.

(21) Appl. No.: 12/647,286

(22) Filed: Dec. 24, 2009

(65) Prior Publication Data

US 2011/0094575 A1    Apr. 28, 2011

Related U.S. Application Data

(60) Provisional application No. 61/279,842, filed on Dec. 24, 2009.

(51) Int. Cl.
*H01L 31/0216* (2014.01)
*H01L 31/18* (2006.01)

(52) U.S. Cl.
CPC .... *H01L 31/02167* (2013.01); *H01L 31/02168* (2013.01); *H01L 31/1868* (2013.01); *Y02E 10/50* (2013.01)

(58) Field of Classification Search
CPC ......... Y02E 10/50; H01L 31/02167–31/02168

USPC ................................................... 136/255, 256
See application file for complete search history.

(56) References Cited

U.S. PATENT DOCUMENTS

| 4,524,237 A | 6/1985 | Ross et al. |
| 4,927,770 A | 5/1990 | Swanson |
| 7,554,031 B2 | 6/2009 | Swanson et al. |

(Continued)

FOREIGN PATENT DOCUMENTS

| CN | 101305472 A | 11/2008 |
| CN | 101383328 A | 3/2009 |

(Continued)

OTHER PUBLICATIONS

Machine translation of CN101383328, pub. Mar. 2009.*

(Continued)

*Primary Examiner* — Allison Bourke
(74) *Attorney, Agent, or Firm* — Schwegman Lundberg & Woessner, P.A.

(57) ABSTRACT

A polarization resistant solar cell using an oxygen-rich interface layer is provided. The oxygen-rich interface layer may be comprised of $SiO_xN_y$, which may have a graded profile that varies between oxygen-rich proximate to the solar cell to nitrogen-rich distal to the solar cell. A silicon oxide passivation layer may be interposed between the solar cell and the $SiO_xN_y$ graded dielectric layer. The graded $SiO_xN_y$ dielectric layer may be replaced with a non-graded $SiO_xN_y$ dielectric layer and a SiN AR coating.

13 Claims, 3 Drawing Sheets

(56) References Cited

U.S. PATENT DOCUMENTS

| | | | |
|---|---|---|---|
| 2007/0137692 A1 | 6/2007 | Carlson et al. | |
| 2007/0175508 A1 | 8/2007 | Park | |
| 2008/0251121 A1 | 10/2008 | Stone | |
| 2009/0056800 A1 | 3/2009 | Ulyashin et al. | |
| 2009/0084438 A1 | 4/2009 | Den Boer et al. | |
| 2009/0223549 A1 | 9/2009 | Ounadjela et al. | |
| 2009/0223562 A1 | 9/2009 | Niira et al. | |
| 2009/0250108 A1 | 10/2009 | Zhou et al. | |
| 2010/0029038 A1* | 2/2010 | Murakawa | 438/97 |
| 2010/0051096 A1 | 3/2010 | Kim et al. | |
| 2011/0094574 A1 | 4/2011 | Zhang et al. | |

FOREIGN PATENT DOCUMENTS

| | | | |
|---|---|---|---|
| CN | 101447532 A | 6/2009 | |
| CN | 101548392 A | 9/2009 | |
| CN | 102668102 A | 9/2012 | |
| EP | 2048699 A2 | 4/2009 | |
| JP | 61-222228 A | 10/1986 | |
| JP | 62179164 | 8/1987 | |
| JP | 2009515336 A | 4/2009 | |
| KR | 1020120087944 A | 8/2012 | |
| KR | 1020120087946 A | 8/2012 | |
| WO | WO-03048060 | 6/2003 | |
| WO | WO-2007055484 A1 | 5/2007 | |
| WO | WO-2008104059 A1 | 9/2008 | |
| WO | WO-20090223549 A1 | 9/2009 | |
| WO | WO-2010002845 A3 | 5/2011 | |
| WO | WO-2011056200 A2 | 5/2011 | |
| WO | WO-2011056200 A3 | 5/2011 | |
| WO | WO-2011056201 A2 | 5/2011 | |

OTHER PUBLICATIONS

"International Application Serial No. PCT/US2010/002844, Internation Written Opinion mailed Jun. 15, 2011", 8 pgs.
"International Application Serial No. PCT/US2010/002844, International Search Report mailed Jun. 15, 2011", 5 pgs.
"International Application Serial No. PCT/US2010/002845, International Search Report mailed Jun. 14, 2011", 3 pgs.
"International Application Serial No. PCT/US2010/002845, Written Opinion mailed Jun. 14, 2011", 7 pgs.
Kang, M. H, et al., "The Study of Silane-Free SiCx Ny Film for Crystalline Silicon Solar Cells", Journal of the Electrochemical Society 2009 Electrochemical Society Inc. USA vol. 156, No. 6, (Apr. 23, 2009), H495-H499.
Lipinski, et al., "Investigation of graded index SiOxNy antireflection coating for silicon solar cell manufacturing", Physica Status Solidi (C), vol. 4, No. 4, XP002639909, (Mar. 30, 2007), 1566-1569.
"U.S. Appl. No. 12/647,201, Final Office Action mailed Oct 17, 2012", 8 pgs.
"U.S. Appl. No. 12/647,201, Non Final Office Action mailed May 17, 2012", 8 pgs.
"U.S. Appl. No. 12/647,201, Response filed Aug. 14, 2012 to Non Final Office Action mailed May 17, 2012", 6 pgs.
"International Application Serial No. PCT/US2010/002844, International Preliminary Report on Patentability mailed May 10, 2012", 8 pgs.
"International Application Serial No. PCT/US2010/002845, International Preliminary Report on Patentability mailed May 10, 2012", 7 pgs.
Kang, M H, et al., "Silane-free PECVD silicon carbon nitride (SiCxNy) passivation and anti-reflection coatings for high efficiency silicon solar cells", 2009 34th IEEE Photovoltaic Specialists Conference (PVSC), (2009), 1724-1726.
Limmanee, A, et al., "Preparation of Hydrogenated Amorphous Silicon Carbon Nitride Films by Hot-Wire Chemical Vapor Deposition Using Hexamethyldisilazane for Silicon Solar Cell Application s", Jpn. J. Appl. Phys., 46, (Jan. 10, 2007), 56-59.
U.S. Appl. No. 12/647,201, Examiner's Answer to Appeal Brief mailed May 13, 2014, 10 pgs.
U.S. Appl. No. 12/647,201, Response filed Jul. 14, 2014 to Examiner's Answer to Appeal Brief mailed May 13, 2014, 3 pgs.
Chinese Application Serial No. 201080048498.9, Office Action mailed May 22, 2014, 17 pgs.
Chinese Application Serial No. 201080048499.3, Office Action mailed Jun. 24, 2014, 9 pgs.
European Application Serial No. 10775941.7, Amendment filed Dec. 27, 2012, 11 pgs.
European Application Serial No. 10775942.5, Amendment filed Dec. 27, 2012, 9 pgs.
European Application Serial No. 10775942.5, Response filed May 19, 2014 to Office Action mailed Jan. 20, 2014, 20 pgs.
Lipinski, M., et al., "Investigation of graded index SiOxNy antireflection coating for silicon solar cell manufacturing", Phys. Stat. Sol. (c) 4, No. 4, (2007), 1566-1569.
"U.S. Appl. No. 12/647,201 , Appeal Brief filed Feb. 27, 2014", 12 pgs.
"U.S. Appl. No. 12/647,201 , Response filed Jan. 17, 2013 to Final Office Action mailed Oct. 17, 2012", 6 pgs.
"U.S. Appl. No. 12/647,201, Final Office Action mailed May 31, 2013", 10 pgs.
"Brazilian Application Serial No. 1120120098772, Amendment filed Oct. 25, 2013", w/English Claims, 10 pgs.
"Brazilian Application Serial No. 1120120098837, Preliminary Amendment mailed Oct. 24, 2013", w/English Claims, 9 pgs.
"European Application Serial No. 10775941.7, Examination Notification Art. 94(3) mailed Feb. 5, 2014", 6 pgs.
"European Application Serial No. 10775942.5, Examination Notification Art. 94(3) mailed Jan. 20, 2014", 4 pgs.
"Japanese Application Serial No. 2012-536790, Office Action mailed Apr. 2, 2014", w/English Translation, 8 pgs.
"Japanese Application Serial No. 2012-536791, Office Action mailed Apr. 2, 2014", w/English Translation, 6 pgs.
"Taiwanese Application Serial No. 99136740, Voluntary Amendment filed Oct. 23, 2013", w/English Claims, 9 pgs.
"Chinese Application Serial No. 201080048498.9, Office Action mailed Jan. 6, 2015", (w/ English Translation), 14 pgs.
"Chinese Application Serial No. 201080048498.9, Response filed Sep. 28, 2014 to Office Action mailed May 22, 2014", (w/ English Translation of Amendment), 14 pgs.
"Chinese Application Serial No. 201080048499.3, Office Action mailed Jan. 12, 2015", (w/ English Translation), 8 pgs.
"Chinese Application Serial No. 201080048499.3, Response filed Mar. 24, 2015 to Office Action mailed Jan. 12, 2015", 2 pgs.
"Chinese Application Serial No. 201080048499.3, Response filed Oct. 21, 2014 to Office Action mailed Jun. 24, 2014", (w/ English Translation of Amendment), 10 pgs.
"European Application Serial No. 10775941.7, Examination Notification Art. 94(3) mailed Mar. 16, 2015", 4 pgs.
"Japanese Application Serial No. 2012-536790, Amendment and Argument filed Feb. 27, 2015 in response to Office Action mailed Nov. 27, 2014", (w/ English Translation), 16 pgs.
"Japanese Application Serial No. 2012-536790, Argument filed in response Sep. 25, 2014 to Office Action mailed Apr. 2, 2014", (w/ English Translation), 8 pgs.
"Japanese Application Serial No. 2012-536790, Office Action mailed Nov. 27, 2014", (w/ English Translation), 4 pgs.
"Japanese Application Serial No. 2012-536791, Amendment and Argument filed Feb. 27, 2015 in response to Office Action mailed Nov. 27, 2014", (w/ English Translation), 14 pgs.
"Japanese Application Serial No. 2012-536791, Amendment and Argument filed in response to Sep. 25, 2014 to Office Action mailed Apr. 2, 2014", (w/ English Translation), 10 pgs.
"Japanese Application Serial No. 2012-536791, Office Action mailed Nov. 27, 2014", (w/ English Translation), 4 pgs.
"Chinese Application Serial No. 201080048498.9, Office Action mailed Jun. 1, 2015", (w/ English Translation), 7 pgs.
"Chinese Application Serial No. 201080048499,3, Office Action mailed Jun. 2, 2015", (w/ English Translation), 16 pgs.
"Japanese Application Serial No. 2012-536790, Examiners Decision of Final Refusal mailed Jun. 1, 2015", (w. English Translation), 4 pgs.

* cited by examiner

US 9,166,071 B2

POLARIZATION RESISTANT SOLAR CELL DESIGN USING AN OXYGEN-RICH INTERFACE LAYER

CROSS-REFERENCE TO RELATED APPLICATION

This application claims the benefit of the filing date of U.S. Provisional Patent Application Ser. No. 61/279,842, filed Oct. 27, 2009, the disclosure of which is incorporated herein by reference for any and all purposes.

FIELD OF THE INVENTION

The present invention relates generally to solar cells and, in particular, to a polarization resistant solar cell design.

BACKGROUND OF THE INVENTION

Photovoltaic cells, commonly referred to as solar cells, are well known semiconductor devices that convert photons into electrical energy. FIG. 1 provides a cross-sectional view of a conventional solar cell 100 that includes a substrate 101 of a first conductivity type, the substrate frequently comprised of silicon, and a layer 103 of a second conductivity type formed on the substrate, commonly referred to as the emitter, thereby forming a p-n junction at the interface. Solar cell 100 also includes a rear surface electrode 105 that is in contact with at least a portion of substrate 101, and a front surface electrode 107 that is in contact with at least a portion of layer 103. When light falls on solar cell 100, electron-hole pairs are created, which are converted by the solar cell into electrical energy.

To enhance the performance of a conventional solar cell, typically a dielectric layer 109 is deposited on the front surface of the solar cell. Dielectric layer 109 serves dual purposes. First, it acts as an anti-reflection (AR) coating, thereby increasing the percentage of incident light that passes into cell 100, resulting in improved conversion efficiency. Second, it forms a passivation layer on the surface of layer 103. In some solar cells, dielectric layer 109 is comprised of a pair of layers; an inner passivation layer and an outer AR layer.

Solar cells are becoming commonplace in a wide range of applications, both due to the increase in energy costs and the growing environmental concerns associated with traditional energy sources. The switch to solar energy has been aided by the gradually improving performance of solar cells and the steady decrease in cell cost. In a typical application, for example a solar array for use on a residential or commercial roof-top or in a solar farm, a large number of solar panels are electrically connected together, each solar panel comprised of a large array of solar cells.

When a solar panel or an array of solar panels is put into operation, a high voltage in excess of 100V may exist between the panel frame or external grounding and one or more terminals of the individual devices. As a result, an electric field is generated that may create a charge on the dielectric layer or layers used in the fabrication of the cell, for example, passivation and AR layer 109 of FIG. 1. Over time, the accumulation of charge on the dielectric layer(s) leads to surface polarization, which, in turn, induces an electric field on the cell's p-n junction. As a result, shunt resistance and p-n junction characteristics are significantly degraded, leading to a major reduction in cell conversion efficiency and potentially complete cessation of cell power output. Accordingly, what is needed is a solar cell design that is resistant to surface polarization but does not significantly affect the fabrication process, the overall cell manufacturing cost, or the cell's performance. The present invention provides such a design.

SUMMARY OF THE INVENTION

The present invention provides a solar cell that is resistant to the polarization effect, the solar cell using an oxygen-rich interface layer.

In at least one embodiment, the oxygen-rich interface layer is a $SiO_xN_y$ layer, which has a graded compositional profile that varies between oxygen-rich proximate to the solar cell substrate to nitrogen-rich distal to the solar cell substrate. The $SiO_xN_y$ layer may use a linear grading profile; alternately, the $SiO_xN_y$ layer may use a non-linear grading profile; alternately, the $SiO_xN_y$ layer may use a stepped grading profile. The solar cell may further comprise a silicon oxide ($SiO_x$) passivation layer interposed between the solar cell and the $SiO_xN_y$ graded layer.

In at least one embodiment, disposed on the front solar cell surface is a dielectric stack of interface layers, the dielectric stack comprised of an $SiO$, layer (inner layer), an $SiO_xN_y$ layer (middle stack layer), and an SiN layer (outer layer).

A further understanding of the nature and advantages of the present invention may be realized by reference to the remaining portions of the specification and the drawings.

DESCRIPTION OF THE SPECIFIC EMBODIMENTS

Figure 1:
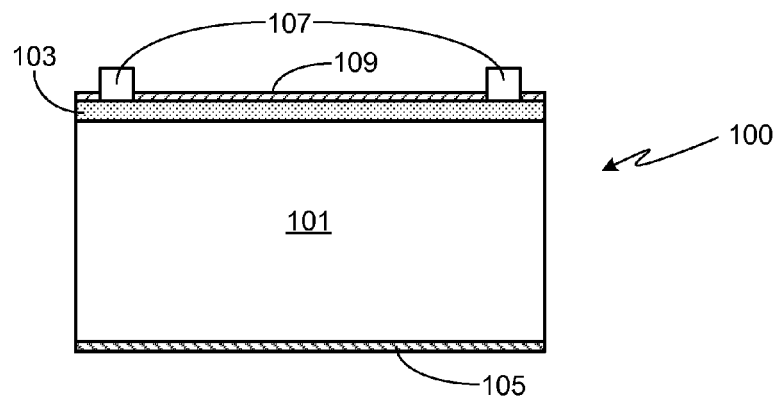
FIG. 1 is a cross-sectional view of a conventional silicon solar cell.
Figure 2:
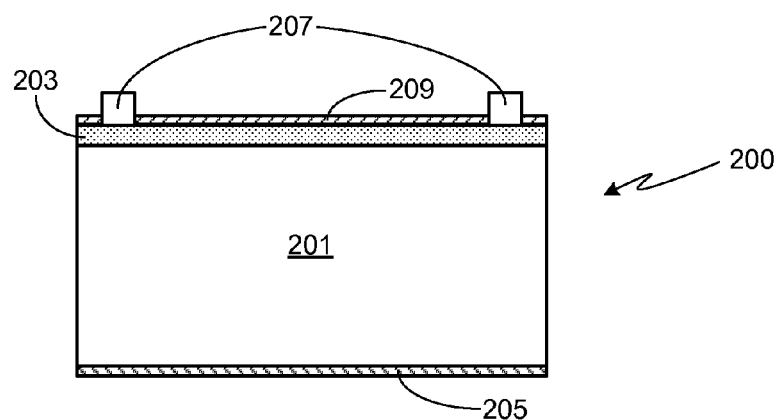
FIG. 2 provides a cross-sectional view of an exemplary device structure in accordance with an embodiment of the invention utilizing a graded dielectric of $SiO_xN_y$.

The inventors have found that the incorporation of an oxygen-rich interface layer in the solar cell design can substantially reduce, if not altogether eliminate, the device degradation that typically occurs in a conventional solar cell that is subjected to a large electric field across the dielectric layer(s). FIG. 2 provides a cross-sectional view of a solar cell device structure 200 in accordance with a preferred embodiment of the invention. Silicon substrate 201 may be of either p- or n-type. As with a conventional solar cell, a silicon layer 203 of a second conductivity type is formed on substrate 201, thereby forming the cell's p-n junction. A rear surface electrode 205, for example comprised of aluminum, contacts at least a portion of substrate 201 or, as shown, the entire back surface of the substrate. To contact the front surface of the device, more specifically layer 203, preferably a plurality of front surface electrodes 207, preferably comprised of silver, are applied to the device's front surface, for example using a finger/busbar configuration as is well known by those of skill in the art.

Figure 3:
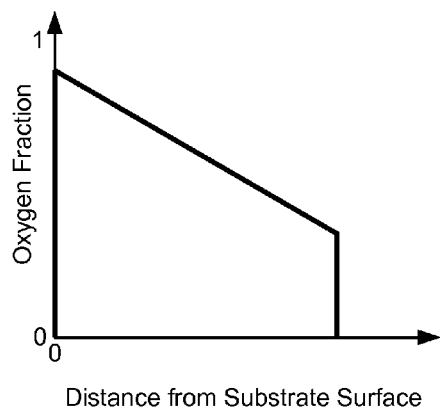
FIG. 3 illustrates a linear compositional profile for use in the device illustrated in FIG. 2.
Figure 4:
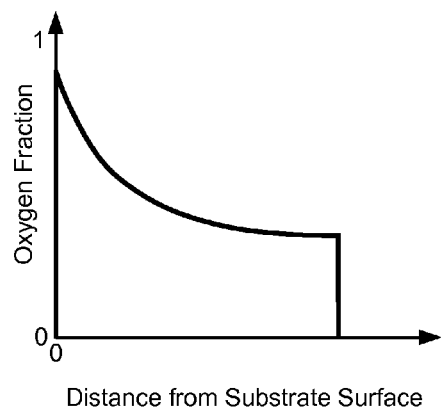
FIG. 4 illustrates a non-linear compositional profile for use in the device illustrated in FIG. 2.
Figure 5:
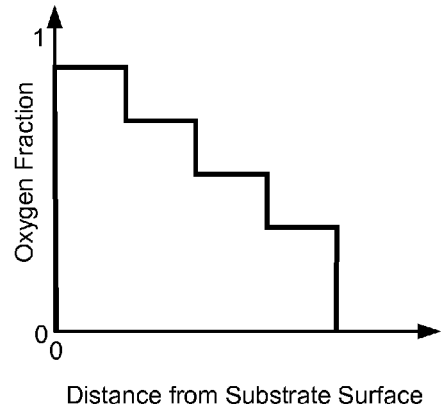
FIG. 5 illustrates a stepped compositional profile for use in the device illustrated in FIG. 2.

In accordance with the invention, a graded dielectric layer 209 is applied to the front surface of cell 200. Dielectric layer 209 is comprised of $SiO_xN_y$ and graded so that the electrochemical potential is greatest near the surface of cell 200, and falls off as the distance from the substrate increases. Accordingly, layer 209 is oxygen rich near the surface of the substrate, and nitrogen rich near the outer surface of the layer. FIGS. 3-5 illustrate three composition profiles for layer 209, each starting near the substrate with a high oxygen fraction that falls away as the distance from the substrate increases. FIG. 3 illustrates a linear variation in composition; FIG. 4 illustrates a non-linear compositional variation such as a parabolic fall-off; and FIG. 5 illustrates a stepped profile.

The amount of oxygen and nitrogen in layer 209 is defined by the fraction of oxygen within the layer, i.e., the ratio between oxygen and the sum of oxygen and nitrogen (i.e., O/O+N). As noted above, the fraction of oxygen in layer 209 near substrate 201/layer 203 is high in order to achieve the desired level of electrochemical potential. Accordingly, in the region of layer 209 near substrate 201/layer 203, the oxygen fraction is in the range of 0.5 to 0.99, and preferably in the range of 0.6 to 0.99. Moving away from substrate 201/layer 203, the oxygen fraction decreases as previously described until the oxygen fraction at the outermost region of layer 209 is in the range of 0.01 to 0.5, and preferably in the range of 0.01 to 0.4. Typically layer 209 has a thickness in the range of 30 to 200 nanometers, and preferably in the range of 50 to 140 nanometers. The refractive index of layer 209 is in the range of 1.5 to 2.4, thus reducing surface reflectivity and increasing the conversion efficiency of the solar cell.

Figure 6:
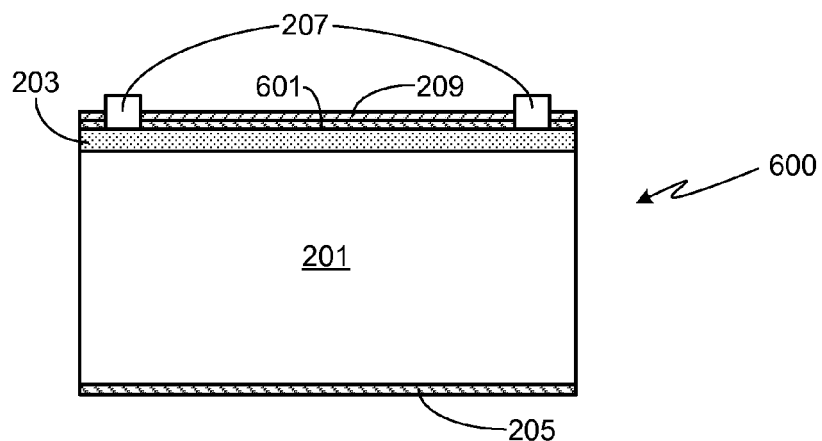
FIG. 6 illustrates a modification of the device shown in FIG. 2 in which a silicon oxide layer is interposed between the substrate and the graded silicon oxynitride layer.

In a modification of the embodiment described above, interposed between the graded $SiO_xN_y$ layer 209 and substrate 201/layer 203 is a silicon oxide ($SiO_x$) passivation layer 601 (FIG. 6). In general, this embodiment is the same as the previously disclosed embodiment except that the graded layer starts out with an oxygen fraction of 1, i.e., the nitrogen content is dropped to zero. After the initial region of zero nitrogen content, the nitrogen content increases while the oxygen content decreases as previously noted and following a standard profile, e.g., linear, non-linear, or stepped. In this configuration, the thickness of layers 209 and 601, combined, is in the range of 30 to 200 nanometers, and preferably in the range of 50 to 140 nanometers. The refractive index of combined layers 601 and 209 is in the range of 1.5 to 2.4.

Figure 7:
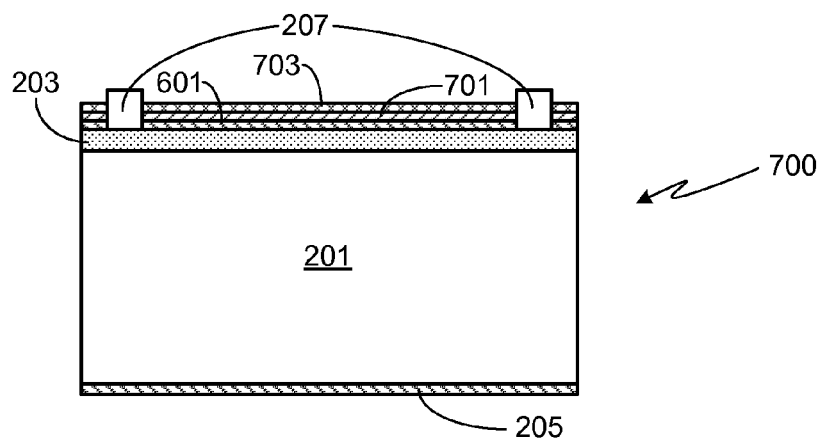
FIG. 7 illustrates a modification of the device shown in FIG. 6 in which the graded silicon oxynitride layer is replaced with a non-graded silicon oxynitride and a separate AR coating.

In a modification of device 600, graded $SiO_xN_y$ layer 209 is replaced with a single composition $SiO_xN_y$ layer 701 (FIG. 7). Next, an AR coating layer 703, preferably comprised of SiN, is applied to layer 701. The dielectric stack has a combined thickness in the range of 3 to 260 nanometers and a refractive index in the range of 1.5 to 2.4.

$SiO_x$ layer 601 has a thickness in the range of 1 to 60 nanometers, preferably in the range of 1 to 30 nanometers, and more preferably in the range of 5 to 20 nanometers. $SiO_xN_y$ layer 701 has a thickness in the range of 1 to 100 nanometers, preferably in the range of 1 to 30 nanometers, and more preferably in the range of 1 to 20 nanometers. The oxygen fraction of $SiO_xN_y$ layer 701 is in the range of 0.01 to 0.99, and preferably in the range of 0.1 to 0.9. SiN layer 703 has a thickness in the range of 1 to 100 nanometers, and preferably in the range of 10 to 90 nanometers, and more preferably in the range of 40 to 90 nanometers.

It will be appreciated that any of a variety of techniques may be used to form layer 203, form the dielectric layers (e.g., layers 209, 601, 701 and 703), and apply contacts 205 and 207, and that the present design is not limited to a specific fabrication methodology. In an exemplary process, the $SiO_xN_y$ layer is deposited using an in-situ silicon oxynitride deposition process (e.g., CVD deposition of $SiO_xN_y$). In an alternate process, the $SiO_xN_y$ layer is formed by first fabricating an oxide layer, preferably greater than 4 nanometers in thickness, using thermal oxidation, chemical oxidation or CVD oxide deposition. Next, a nitride layer is deposited in such a way that some or all of the fabricated silicon oxide transforms into a silicon oxynitride of the desired thickness and graded composition. Alternately, the previously fabricated oxide layer can be annealed in a nitrogen-rich environment, thereby transforming the silicon oxide to the desired silicon oxynitride.

It should be understood that identical element symbols used on multiple figures refer to the same structure, or structures of equal functionality. Additionally, the accompanying figures are only meant to illustrate, not limit, the scope of the invention and should not be considered to be to scale.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention.

What is claimed is:

1. A solar cell comprising:
   a substrate comprised of silicon of a first conductivity type;
   a layer of silicon of a second conductivity type disposed on said substrate; and
   a graded layer forming a direct interface with said layer of silicon, wherein said graded layer comprises $SiO_xN_y$, wherein the graded layer composition includes non-zero amounts of oxygen throughout the entirety of the graded layer, and non-zero amounts of nitrogen throughout the entirety of the graded layer and the graded layer oxygen content varies non-linearly from oxygen-rich proximate to said layer of silicon to nitrogen-rich distal to said layer of silicon; and wherein said graded layer has a thickness of between 30 and 200 nanometers.

2. The solar cell of claim 1, wherein a ratio of oxygen within said graded layer of $SiO_xN_y$ to the sum of oxygen and nitrogen with said graded layer of $SiO_xN_y$ varies between a first range within a first region of said graded layer to a second range within a second region of said graded layer, wherein said first region of said graded layer is proximate to said layer of silicon and said second region of said graded layer is distal to said layer of silicon, and wherein said first range is 0.5 to 0.99 and said second range is 0.01 to 0.5.

3. The solar cell of claim 1, wherein a ratio of oxygen within said graded layer of $SiO_xN_y$ to the sum of oxygen and nitrogen within said graded layer of $SiO_xN_y$ varies between a first range within a first region of said graded layer to a second range within a second region of said graded layer, wherein said first region of said graded layer is proximate to said layer of silicon and said second region of said graded layer is distal to said layer of silicon, and wherein said first range is 0.6 to 0.99 and said second range is 0.01 to 0.4.

4. The solar cell of claim 1, wherein a ratio of oxygen within said graded layer of $SiO_xN_y$ to the sum of oxygen and nitrogen with said graded layer of $SiO_xN_y$ follows a stepped profile between a first range within a first region of said graded layer to a second range within a second region of said graded layer, wherein said first region of said graded layer is proximate to said layer of silicon and said second region of said graded layer is distal to said layer of silicon.

5. The solar cell of claim 1, wherein said graded layer has a thickness of between 50 and 140 nanometers.

6. The solar cell of claim 1, wherein said graded layer has a refractive index in the range of 1.5 to 2.4.

7. A solar cell comprising:
a substrate comprised of silicon of a first conductivity type;
a layer of silicon of a second conductivity type disposed on said substrate; and
a dielectric stack disposed on said layer of silicon, wherein said dielectric stack is comprised of:
a first dielectric layer comprised of $SiO_x$, wherein said first dielectric layer forms a direct interface with said layer of silicon;
a graded layer forming a direct interface with said first dielectric layer, wherein said graded layer comprises $SiO_xN_y$, wherein the graded layer composition includes non-zero amounts of oxygen throughout the entirety of the graded layer, and non-zero amounts of nitrogen throughout the entirety of the graded layer and the graded layer composition varies non-linearly from oxygen-rich proximate to said first dielectric layer to nitrogen-rich distal to said first dielectric layer; and
said dielectric stack has a thickness of between 3 to 260 nanometers.

8. The solar cell of claim 7, wherein said dielectric stack has a refractive index in the range of 1.5 to 2.4.

9. The solar cell of claim 7, wherein said first dielectric layer has a thickness of between 1 to 60 nanometers, said second dielectric layer has a thickness of between 1 to 100 nanometers, and said third dielectric layer has a thickness of between 1 to 100 nanometers.

10. The solar cell of claim 7, wherein said first dielectric layer has a thickness of between 1 to 30 nanometers, said second dielectric layer has a thickness of between 1 to 30 nanometers, and said third dielectric layer has a thickness of between 10 to 90 nanometers.

11. The solar cell of claim 7, wherein said first dielectric layer has a thickness of between 5 to 20 nanometers, said second dielectric layer has a thickness of between 1 to 20 nanometers, and said third dielectric layer has a thickness of between 1 to 20 nanometers, and said third dielectric layer has a thickness of between 40 to 90 nanometers.

12. The solar cell of claim 7, wherein a ratio of oxygen within said graded layer of $SiO_xN_y$ to the sum of oxygen and nitrogen with said graded layer of $SiO_xN_y$ varies between a first range within a first region of said graded layer to a second range within a second region of said graded layer, wherein said first region of said graded layer is proximate to said first dielectric layer and said second region of said graded layer is distal to said first dielectric layer, and wherein said first range is 0.5 to 0.99 and said second range is 0.01 to 0.5.

13. The solar cell of claim 7, wherein a ratio of oxygen within said graded layer of $SiO_xN_y$ to the sum of oxygen and nitrogen with said graded layer of $SiO_xN_y$ varies between a first range within a first region of said graded layer to a second range within a second region of said graded layer, wherein said first region of said graded layer is proximate to said first dielectric layer and said second region of said graded layer is distal to said first dielectric layer, and wherein said first range is 0.6 to 0.99 and said second range is 0.01 to 0.4.

* * * * *